United States Patent
Yamamoto et al.

(10) Patent No.: US 12,224,199 B2
(45) Date of Patent: Feb. 11, 2025

(54) SEMICONDUCTOR MANUFACTURING APPARATUS AND METHOD FOR MANUFACTURING SEMICONDUCTOR DEVICE

(71) Applicant: Mitsubishi Electric Corporation, Tokyo (JP)

(72) Inventors: Takafumi Yamamoto, Fukuoka (JP); Takuya Nomoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 695 days.

(21) Appl. No.: 17/518,727

(22) Filed: Nov. 4, 2021

(65) Prior Publication Data
US 2022/0310437 A1  Sep. 29, 2022

(30) Foreign Application Priority Data
Mar. 29, 2021 (JP) .................. 2021-055492

(51) Int. Cl.
H01L 21/683 (2006.01)
H01L 21/02 (2006.01)
H01L 21/66 (2006.01)

(52) U.S. Cl.
CPC .... *H01L 21/6838* (2013.01); *H01L 21/02263* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 6,211,081 B1* | 4/2001 | Mikata | ................ | H01L 21/0262 438/798 |
| 6,383,897 B2* | 5/2002 | Mikata | ................ | H01L 21/0262 438/479 |
| 7,482,283 B2* | 1/2009 | Yamasaki | ......... | H01L 21/28556 438/758 |
| 2005/0082385 A1* | 4/2005 | Kuwada | .............. | C23C 16/4557 239/128 |
| 2023/0129351 A1* | 4/2023 | Sekido | ............. | C23C 16/45561 118/715 |

FOREIGN PATENT DOCUMENTS

| | | |
|---|---|---|
| EP | 3282475 A1 | 2/2018 |
| JP | 2001-035906 A | 2/2001 |
| JP | 2013-149809 A | 8/2013 |
| JP | 2016-197707 A | 11/2016 |

* cited by examiner

*Primary Examiner* — Jethro M. Pence
(74) *Attorney, Agent, or Firm* — Studebaker & Brackett PC (57) ABSTRACT

According to an aspect of the present disclosure, a semiconductor manufacturing apparatus includes a stage having a mounting region for a wafer on an upper surface, a plurality of sucking pipes extending from the mounting region to a back surface side of the stage through the stage, a vacuum pump that is connected to the plurality of sucking pipes and sucks the wafer onto the mounting region via the plurality of sucking pipes, a cup provided on the upper surface of the stage and covering the wafer, a gas supply line that pressurizes a space surrounded by the upper surface of the stage and the cup and a pressure sensor that detects pressure in the plurality of sucking pipes.

10 Claims, 6 Drawing Sheets

SEMICONDUCTOR MANUFACTURING APPARATUS AND METHOD FOR MANUFACTURING SEMICONDUCTOR DEVICE

BACKGROUND OF THE INVENTION

Field

The present disclosure relates to a semiconductor manufacturing apparatus and a method for manufacturing a semiconductor device.

Background

JP 2013-149809 A discloses a foreign object detection method in a suction stage. The suction stage includes: a placement portion onto which a substrate is sucked and fixed; pressure measurement means for measuring the suction pressure of the substrate in the placement portion; and a determination unit that determines the presence or absence of a suction abnormality of the substrate. The foreign object detection method includes a measurement step and a determination step. In the measurement step, the pressure measurement means measures the suction pressure of the substrate on the placement surface. In the determination step, the determination unit compares and evaluates fluctuation data with reference fluctuation data. The fluctuation data is data of a period from the start of suction of the substrate to the time before the numerical value of the suction pressure becomes stable, among suction pressure data acquired in the measurement step. The reference fluctuation data is fluctuation data created when no foreign object is present on the placement surface and is stored into the determination unit in advance. Thus, the determination unit determines the presence or absence of a suction abnormality on the placement surface to determine the presence or absence of a foreign object on the placement surface.

The foreign object detection method shown in JP 2013-149809 is a technique for detecting a foreign object on the stage. Hence there is a possibility that a defect in a semiconductor wafer mounted on the stage cannot be detected because the fluctuation of suction pressure due to the defect is excessively small.

SUMMARY

It is an object of the present invention to provide a semiconductor manufacturing apparatus and a method for manufacturing a semiconductor device that can detect a defect in a wafer.

The features and advantages of the present disclosure may be summarized as follows.

According to an aspect of the present disclosure, a semiconductor manufacturing apparatus includes a stage having a mounting region for a wafer on an upper surface, a plurality of sucking pipes extending from the mounting region to a back surface side of the stage through the stage, a vacuum pump that is connected to the plurality of sucking pipes and sucks the wafer onto the mounting region via the plurality of sucking pipes, a cup provided on the upper surface of the stage and covering the wafer, a gas supply line that pressurizes a space surrounded by the upper surface of the stage and the cup and a pressure sensor that detects pressure in the plurality of sucking pipes.

According to an aspect of the present disclosure, a method for manufacturing a semiconductor device, the method includes mounting a wafer in a mounting region provided on an upper surface of a stage, mounting a cup on the upper surface of the stage to cover the wafer, supplying gas to a space surrounded by the upper surface of the stage and the cup to pressurize the wafer, sucking the wafer onto the mounting region by a vacuum pump connected to a plurality of sucking pipes extending from the mounting region to a back surface side of the stage through the stage, detecting the pressure in the plurality of sucking pipes while pressurizing the wafer and sucking the wafer onto the mounting region and performing cleaning, film formation, photolithography, etching, diffusion treatment, or ion implantation on the wafer after detecting the pressure in the plurality of sucking pipes.

Other and further objects, features and advantages of the disclosure will appear more fully from the following description.

DESCRIPTION OF EMBODIMENTS

Semiconductor manufacturing apparatuses and methods for manufacturing semiconductor devices according to embodiments of the present disclosure will be described with reference to the accompanying drawings. Components identical or corresponding to each other are indicated by the same reference characters, and repeated description of them is avoided in some cases.

First Embodiment

Figure 1:
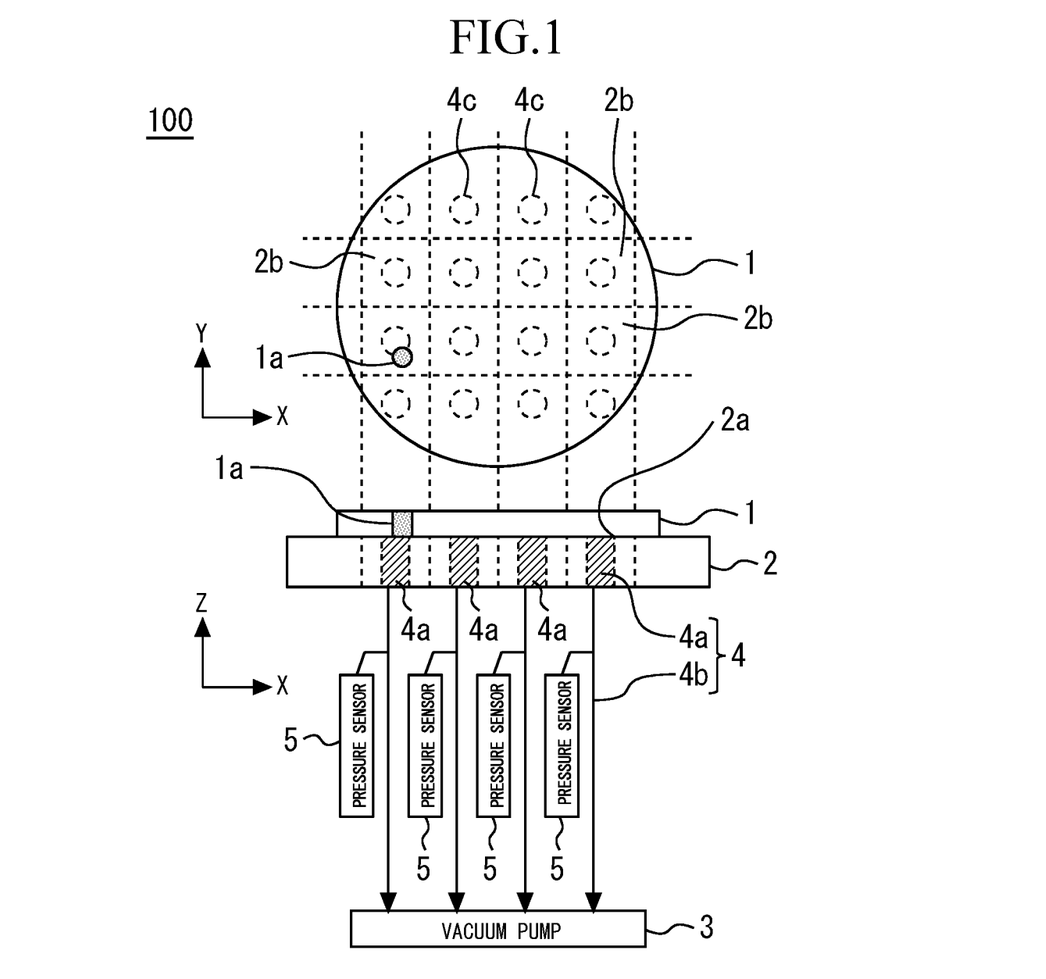
FIG. 1 is a plan view and a front view of a semiconductor manufacturing apparatus according to a first embodiment.

FIG. 1 is a plan view and a front view of a semiconductor manufacturing apparatus 100 according to a first embodiment. The semiconductor manufacturing apparatus 100 includes, on the upper surface, a stage 2 having a mounting region 2a for a wafer 1. The wafer 1 is a semiconductor substrate. The semiconductor manufacturing apparatus 100 includes a plurality of sucking pipes 4 extending from the mounting region 2a toward the back surface side of the stage 2 through the stage 2. Each sucking pipe 4 has a first portion 4a provided inside the stage 2 and a second portion 4b extending from the back surface of the stage 2 and provided outside the stage 2. The vacuum pump 3 is connected to the plurality of sucking pipes 4 and sucks the wafer 1 onto the mounting region 2a via the plurality of sucking pipes 4. Each sucking pipe 4 is provided with a pressure sensor 5. The pressure sensor 5 detects the pressure in the sucking pipe 4.

The stage 2 is virtually divided into a grid form to form a plurality of suction areas 2b. Each of the plurality of suction areas 2b is provided with the sucking pipe 4. In FIG. 1, the positions of sucking ports 4c of the plurality of sucking pipes 4 are indicated by dotted lines. The sucking ports 4c are arranged in a grid form in the mounting region 2a. The vacuum pump 3 vacuum sucks the wafer 1 onto each suction area 2b.

The pressure sensor 5 connected to the sucking pipe 4 monitors the pressure for each suction area 2b. When the wafer 1 having a defect 1a such as a through hole is sucked, different pressure is obtained in the suction area 2b having the defect 1a from the pressure in the suction area 2b having no defect 1a. In this manner, pressure fluctuation can be detected by the pressure sensor 5 to detect a defect.

The size of the suction area 2b is determined in accordance with the size of the defect 1a to be detected. For example, when a wafer diameter is 8 inches, and a defect of about 10 μm to 1 cm square is to be detected, the suction area may only be 1 cm square. In this case, the number of suction areas 2b is about 20 per row. Accordingly, it is sufficient to provide about 400 pressure sensors 5. The number of pressure sensors 5 per row or as a whole may be changed in accordance with the diameter of the wafer 1. For example, when the diameter of the wafer 1 is 4 inches to 12 inches, and the suction area 2b is 1 cm square, it is sufficient to provide about 10 to 30 pressure sensors 5 per row, for a total of about 100 to 900 pressure sensors 5.

Figure 2:
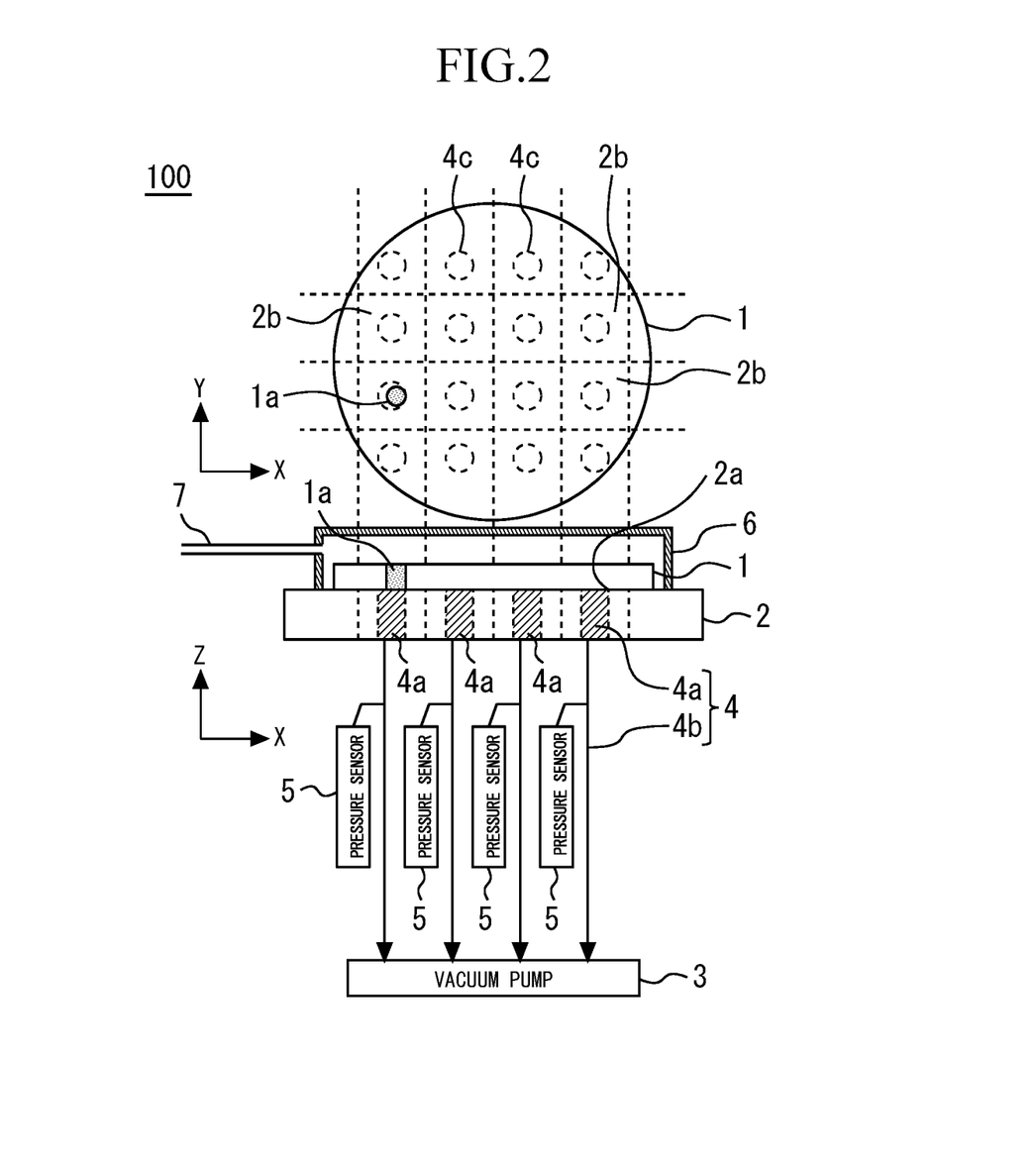
FIG. 2 is a plan view and a front view illustrating a state where a cup is attached to the semiconductor manufacturing apparatus according to the first embodiment.

FIG. 2 is a plan view and a front view illustrating a state where a cup 6 is attached to the semiconductor manufacturing apparatus 100 according to the first embodiment. The semiconductor manufacturing apparatus 100 includes the cup 6 provided on the upper surface of the stage 2 and covering the wafer 1. The cup 6 has a box shape or a dome shape. The cup 6 is in close contact with the stage 2 so as to ensure interior airtightness. The cup 6 is connected to a gas supply line 7. The gas supply line 7 pressurizes the space surrounded by the upper surface of the stage 2 and the cup 6. The gas supply line 7 supplies, for example, N2 into the cup 6.

The gas sealed in the cup 6 presses the entire surface of the wafer 1 against the stage 2. Thus, pressure fluctuation occurs in the sucking pipe 4 due to the defect state on the surface of the wafer 1. When the defect is a through hole, the gas supplied from the gas supply line 7 via the defect leaks into the sucking pipe 4. As a result, pressure fluctuation occurs in the sucking pipe 4. Therefore, the defect detection sensitivity can be improved, and a defect in the wafer 1 such as a through hole can be detected. In the present embodiment, even a minute defect of, for example, 10 μm to 1 cm, can be detected. As a defect to be detected in the present embodiment, for example, a through hole such as a micropipe, a crack reaching the back surface of the wafer 1 from the front surface thereof, and the like are assumed.

The wafer 1 is made of silicon. Alternatively, the wafer 1 may be formed of a wide bandgap semiconductor having a larger bandgap than silicon. The wide bandgap semiconductor is, for example, silicon carbide, gallium nitride-based material, or diamond. In particular, silicon carbide has many crystal polymorphisms, and it is difficult to form a SiC crystal with only one crystal polymorphism. As compared with silicon, silicon carbide tends to cause a defect due to the incorporation of other crystal polymorphs during crystal growth. Hence a through hole, such as a micropipe, tends to be formed. Therefore, the present embodiment is particularly effective when the wafer 1 is formed of a wide bandgap semiconductor.

Further, silicon or silicon carbide is a transparent material. For this reason, light passes through the wafer 1, and it is difficult to detect the defect with light. In contrast, in the present embodiment, since the defect is detected by pressure fluctuation, it is possible to detect the defect even in the wafer 1 through which light passes. The micropipe is generally formed obliquely. It is thus difficult to detect the micropipe with light. In contrast, in the present embodiment, the defect is detected by subdividing the suction area 2b and vacuum sucking the wafer 1 onto each suction area 2b. Hence it is possible to improve the detection sensitivity of the micropipe.

Figure 3:
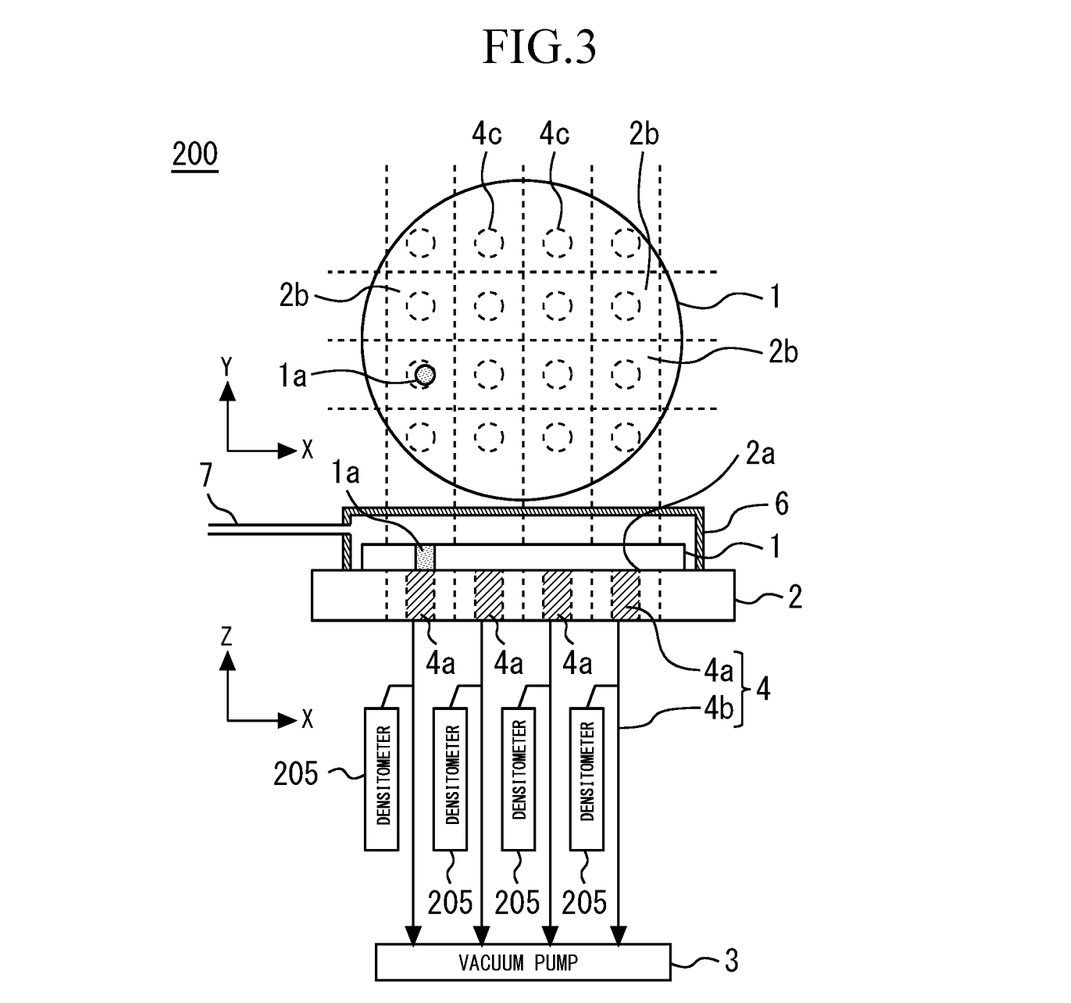
FIG. 3 is a plan view and a front view of a semiconductor manufacturing apparatus according to a modification of the first embodiment.

FIG. 3 is a plan view and a front view of a semiconductor manufacturing apparatus 200 according to a modification of the first embodiment. As the gas supplied by the gas supply line 7, He may be supplied in addition to N2. The semiconductor manufacturing apparatus 200 may also include a densitometer 205 that detects the concentration of the He gas, supplied by the gas supply line 7, in each of the plurality of sucking pipes 4. The densitometer 205 is provided in each sucking pipe 4.

In the semiconductor manufacturing apparatus 200, the He gas leaks into the sucking pipe 4 via the defect, so that the concentration of He gas in the sucking pipe 4 changes. By using the pressure sensor 5 and the densitometer 205 together in this manner, it is possible to detect even a more minute defect penetrating through the wafer 1. Further, the He gas is easy to handle since being a gas generally used for leak checking. Although the example in which the pressure sensor 5 and the densitometer 205 are used together has been described, only the densitometer 205 may be provided.

These modifications can be appropriately applied to semiconductor manufacturing apparatuses and methods for manufacturing semiconductor devices according to embodiments below. Meanwhile, for the semiconductor manufacturing apparatuses and the methods for manufacturing the semiconductor devices according to the embodiments below, dissimilarities with the first embodiment will mainly be explained as they have many similarities with the first embodiment.

Second Embodiment

Figure 4:
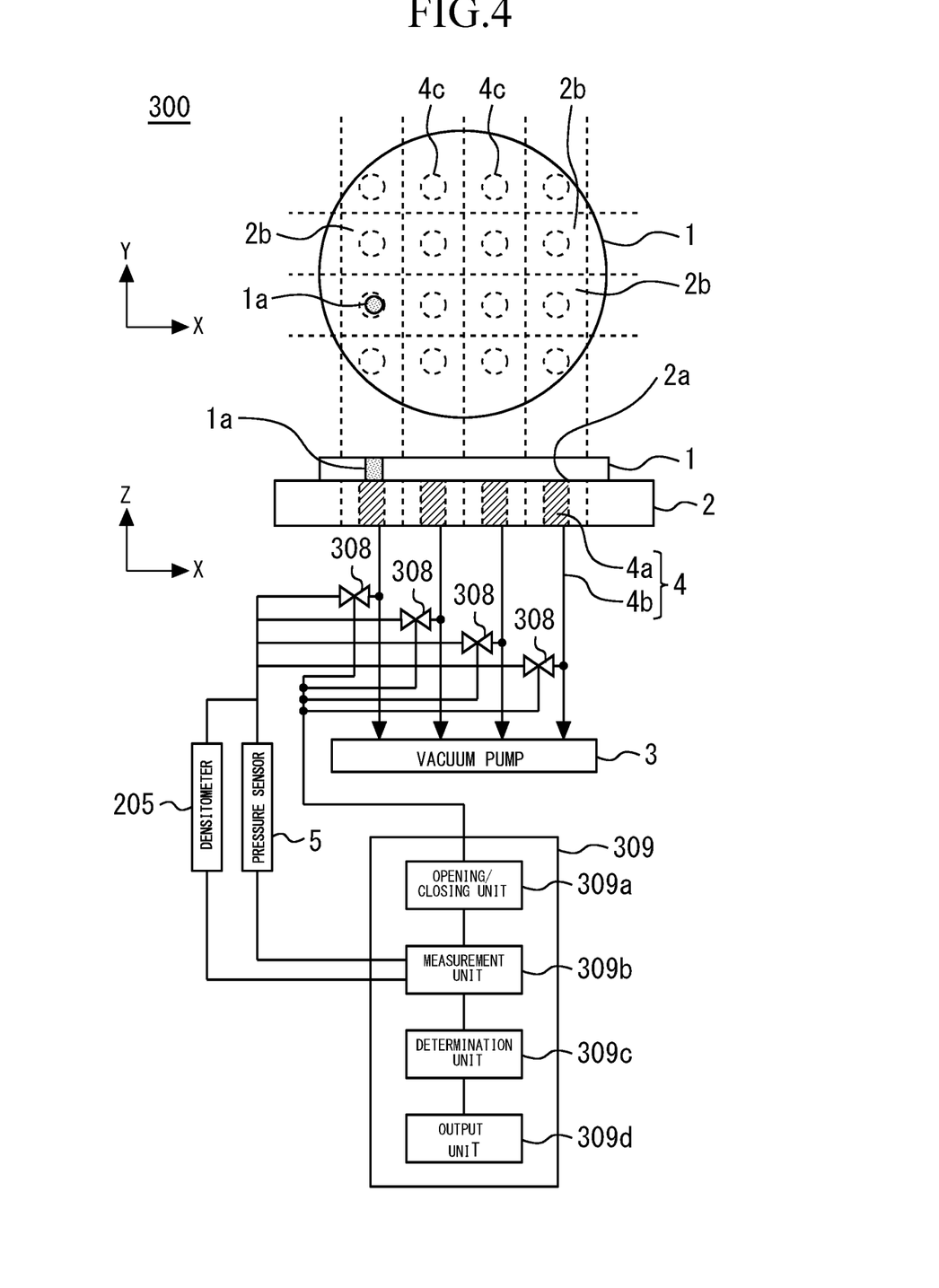
FIG. 4 is a plan view and a front view of a semiconductor manufacturing apparatus according to a second embodiment.

FIG. 4 is a plan view and a front view of a semiconductor manufacturing apparatus 300 according to a second embodiment. The semiconductor manufacturing apparatus 300 includes one pressure sensor 5. The semiconductor manufacturing apparatus 300 includes a plurality of valves 308 provided respectively between a plurality of sucking pipes 4 and a pressure sensor 5. Each suction area 2b and the pressure sensor 5 are connected via the valve 308.

Further, the semiconductor manufacturing apparatus 300 includes a detector 309 that detects the presence or absence of a defect in a region of the wafer 1 that each of the plurality of sucking pipes 4 sucks, from the pressure measured by the pressure sensor 5. The detector 309 sequentially brings the plurality of valves 308 into an open state and detects, from the pressure in the sucking pipe 4 corresponding to each of the valves 308 in the open state, the presence or absence of a defect in a region of the wafer 1 that the sucking pipe 4 sucks.

The detector 309 includes, for example, an opening/closing unit 309a, a measurement unit 309b, a determination unit 309c, and an output unit 309d. The opening/closing unit 309a controls the opening and closing of the valves 308 and sequentially switches the plurality of valves 308 into the open state. The measurement unit 309b measures the pressure in the sucking pipe 4 corresponding to the valve 308 in the open state. The determination unit 309c determines the presence or absence of a defect from the pressure measured by the measurement unit 309b. The output unit 309d outputs the determination result of the determination unit 309c.

In the suction area 2b corresponding to the valve 308 in a closed state, the wafer 1 is vacuum sucked. In the suction area 2b corresponding to the valve 308 in the open state, the presence or absence of a defect in the wafer 1 is determined. This enables the inspection by one pressure sensor 5. Therefore, space saving and cost reduction can be achieved.

Similarly, the semiconductor manufacturing apparatus 300 may include one densitometer 205, and each suction area 2b and the densitometer 205 may be connected via the valve 308. In this case, the detector 309 detects the presence or absence of a defect in a region of the wafer 1 that each of the plurality of sucking pipes 4 sucks, from the gas concentration measured by the densitometer 205. The detector 309 sequentially brings the plurality of valves 308 into the open state and detects, from the gas concentration in the sucking pipe 4 corresponding to each of the valves 308 in the open state, the presence or absence of a defect in a region of the wafer 1 that the sucking pipe 4 sucks. At this time, the measurement unit 309b measures the gas concentration in the sucking pipe 4 corresponding to the valve 308 in the open state. The determination unit 309c determines the presence or absence of a defect from the concentration measured by the measurement unit 309b.

Figure 5:
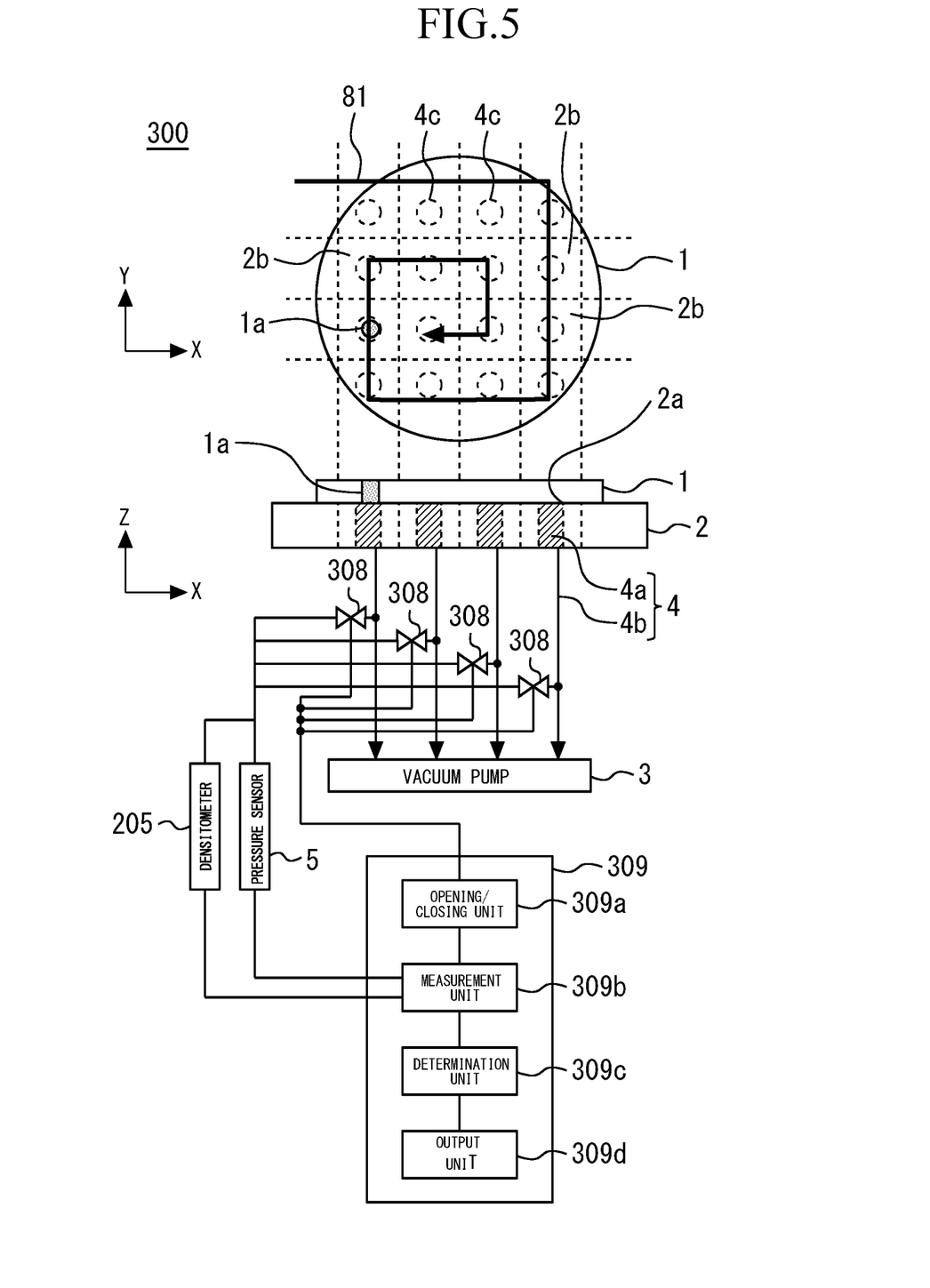
FIG. 5 is a view for explaining a method for inspecting a semiconductor device according to the second embodiment.

FIG. 5 is a view for explaining a method for inspecting a semiconductor device according to the second embodiment. As indicated by an arrow 81 in FIG. 5, the defect may be detected in order from the peripheral portion of the wafer 1 toward the center thereof. That is, the detector 309 may detect the presence or absence of a defect in the center of the wafer 1 after detecting the presence or absence of a defect in the peripheral portion of the wafer 1. In the example illustrated in FIG. 5, the inspection is performed in order in the circumferential direction of the wafer 1. In general, a defect tends to occur in the peripheral portion of the wafer 1. This is because physical stress is applied to the peripheral portion by contact with a cassette for storing the wafer 1 or a device for mounting the wafer 1. Therefore, by performing the inspection from the peripheral portion, the inspection time can be shortened, and the productivity can be improved.

The detector 309 of the present embodiment may be provided in the semiconductor manufacturing apparatus 100 or the semiconductor manufacturing apparatus 200 of the first embodiment. In this case, the opening/closing unit 309a may not be provided.

Third Embodiment

Figure 6:
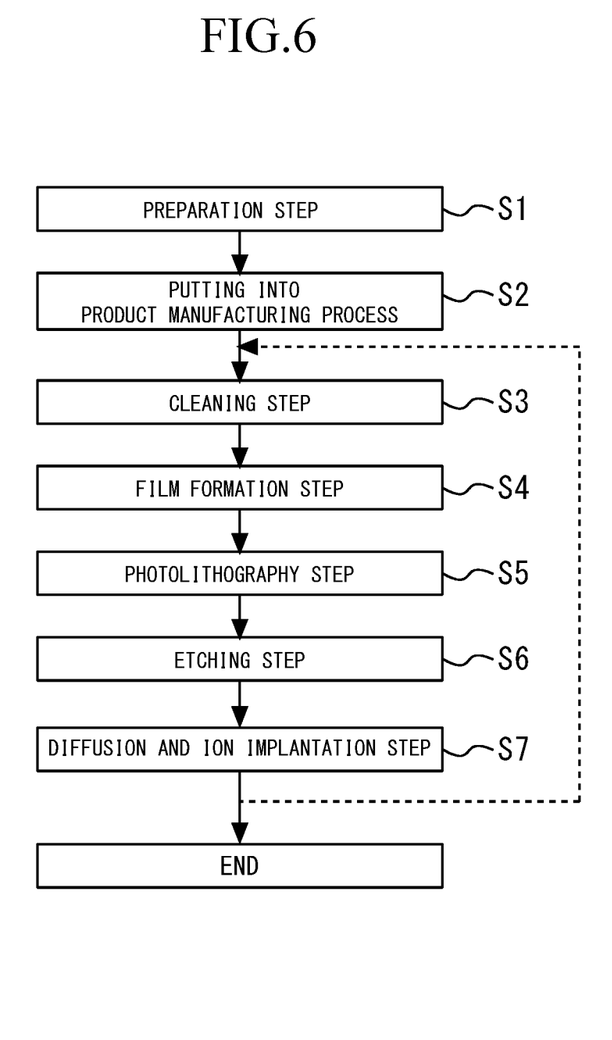
FIG. 6 is a flowchart for explaining a method for manufacturing a semiconductor device according to a third embodiment.

FIG. 6 is a flowchart for explaining a method for manufacturing a semiconductor device according to a third embodiment. FIG. 6 illustrates a method for manufacturing a semiconductor device by using the semiconductor manufacturing apparatus according to the first or second embodiment. First, as step S1, a preparation step for preparing the wafer 1 is performed. In the preparation step, an ingot of, for example, silicon or silicon carbide is sliced to a predetermined thickness to prepare the wafer 1. In step S1, epitaxial growth may be performed on the sliced substrate to prepare the wafer 1.

Next, as step S2, the wafer 1 is put into a product manufacturing process. A semiconductor device manufacturing process, which is the product manufacturing process, includes a cleaning step shown in step S3, a film formation step shown in step S4, a photolithography step shown in step S5, an etching step shown in step S6, and a diffusion and ion implantation step shown in step S7. A well-known manufacturing method can be applied to these steps. The film formation step includes oxidation, chemical vapor deposition (CVD), metallizing, and the like.

In the inspection step using the semiconductor manufacturing apparatus 100, the wafer 1 is mounted on the mounting region 2a provided on the upper surface of the stage 2. Next, the cup 6 is mounted on the upper surface of the stage 2 to cover the wafer 1. Then, gas is supplied to the space surrounded by the upper surface of the stage 2 and the cup 6 to pressurize the wafer 1. The vacuum pump 3 sucks the wafer 1 onto the mounting region 2a. Further, the pressure in each of the plurality of sucking pipes 4 is detected while the wafer 1 is pressurized with gas sucked onto the mounting region 2a. When the semiconductor manufacturing apparatus 200 or 300 is used, the gas concentration in each of the plurality of sucking pipes 4 is detected while the wafer 1 is pressurized with gas sucked onto the mounting region 2a. Thereby, the presence or absence of a defect in the wafer 1 is inspected.

The present embodiment includes an inspection step performed by the semiconductor manufacturing apparatus 100, 200, or 300 before at least one of the cleaning step, the film formation step, the photolithography step, the etching step, and the diffusion and ion implantation step. That is, after the pressure or gas concentration in each of the plurality of sucking pipes 4 is detected and the inspection is performed, the wafer 1 is subjected to cleaning, film formation, photolithography, etching, diffusion treatment, or ion implantation. As a result, in the semiconductor device manufacturing process, it is possible to prevent secondary trouble such as stage abnormality that may occur due to processing of a defective wafer.

By performing the inspection step before each step, for example, the following effects can be obtained. By performing the inspection step before the cleaning step or the photolithography step, it is possible to prevent the corrosion of the stage due to the inflow of a chemical solution from the defect. Further, the contamination of the subsequent wafer can be prevented. By performing the inspection step before the film formation step, it is possible to prevent a product obtained by film formation from passing through the defect and being deposited on the stage. By performing the inspection step before the etching step, it is possible to prevent the corrosion of the stage due to the inflow of an etching gas from the defect. Further, the contamination of the subsequent wafer can be prevented. By performing the inspection step before the diffusion and ion implantation step, it is possible to prevent stage burning due to laser irradiation of the defect during laser annealing or the like.

Meanwhile, technical features explained in each embodiment may be appropriately combined to use.

In the semiconductor manufacturing apparatus and the method for manufacturing a semiconductor device according to the present disclosure, gas can be supplied to the space enclosed by the upper surface of the stage and the cup to pressurize the wafer. Accordingly, a defect in the wafer can be detected.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-055492, filed on Mar. 29, 2021 including specification, claims, drawings and summary, on which the Convention priority of the present application is based, are incorporated herein by reference in its entirety.

The invention claimed is:

1. A semiconductor manufacturing apparatus comprising:
a stage having a mounting region for a wafer on an upper surface;
a plurality of sucking pipes extending from the mounting region to a back surface side of the stage through the stage;
a vacuum pump that is connected to the plurality of sucking pipes and sucks the wafer onto the mounting region via the plurality of sucking pipes;
a cup provided on the upper surface of the stage and covering the wafer;
a gas supply line that pressurizes a space surrounded by the upper surface of the stage and the cup; and
a pressure sensor that detects pressure in the plurality of sucking pipes.

2. The semiconductor manufacturing apparatus according to claim 1, further comprising a detector that detects presence or absence of a defect in a region of the wafer that each of the plurality of sucking pipes sucks, from the pressure measured by the pressure sensor.

3. The semiconductor manufacturing apparatus according to claim 1, further comprising a densitometer that detects a concentration of gas supplied from the gas supply line in the plurality of sucking pipes.

4. The semiconductor manufacturing apparatus according to claim 1, wherein the pressure sensor is provided in each of the plurality of sucking pipes.

5. The semiconductor manufacturing apparatus according to claim 2, further comprising a plurality of valves provided respectively between the plurality of sucking pipes and the pressure sensor,
wherein the detector sequentially brings the plurality of valves into an open state and detects the presence or absence of the defect in a region of the wafer that the sucking pipe corresponding to the valve in the open state sucks, from the pressure in the sucking pipe corresponding to the valve in the open state.

6. The semiconductor manufacturing apparatus according to claim 5, wherein the detector detects the presence or absence of the defect in a center of the wafer after detecting the presence or absence of the defect in a peripheral portion of the wafer.

7. The semiconductor manufacturing apparatus according to claim 1, wherein sucking ports of the plurality of sucking pipes are arranged in a grid form in the mounting region.

8. The semiconductor manufacturing apparatus according to claim 1, wherein the gas supplied through the gas supply line is He or N2.

9. The semiconductor manufacturing apparatus according to claim 1, wherein the wafer is made with a wide bandgap semiconductor.

10. The semiconductor manufacturing apparatus according to claim 9, wherein the wide bandgap semiconductor is silicon carbide, a gallium nitride-based material or diamond.

* * * * *